United States Patent
Higo et al.

(10) Patent No.: US 9,331,270 B2
(45) Date of Patent: May 3, 2016

(54) MAGNETIC MEMORY ELEMENT AND MEMORY APPARATUS HAVING MULTIPLE MAGNETIZATION DIRECTIONS

(71) Applicant: Sony Corporation, Tokyo (JP)

(72) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Tetsuya Asayama, Tokyo (JP); Kazutaka Yamane, Kanagawa (JP); Hiroyuki Uchida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/330,748

(22) Filed: Jul. 14, 2014

(65) Prior Publication Data
US 2014/0319633 A1    Oct. 30, 2014

Related U.S. Application Data

(63) Continuation of application No. 13/675,789, filed on Nov. 13, 2012, now Pat. No. 8,809,978.

(30) Foreign Application Priority Data

Nov. 30, 2011    (JP) .................................. 2011-261522

(51) Int. Cl.
*H01L 29/82* (2006.01)
*H01L 43/10* (2006.01)
(Continued)

(52) U.S. Cl.
CPC .............. *H01L 43/10* (2013.01); *G11C 11/161* (2013.01); *H01L 27/222* (2013.01); *H01L 27/228* (2013.01); *H01L 29/82* (2013.01); *H01L 43/08* (2013.01)

(58) Field of Classification Search
CPC ..... H01L 43/08; H01L 29/82; H01L 23/5226; H01L 23/528; H01L 27/222; H01L 43/065; G11C 11/16

USPC ........ 257/20, 414, 421–427, E29.323; 438/3; 365/157–158, 171–173; 360/327–326
See application file for complete search history.

(56) References Cited

U.S. PATENT DOCUMENTS 6,600,184 B1 *  7/2003  Gill .............................. 257/295
6,710,984 B1 *  3/2004  Yuasa et al. .............. 360/324.11
(Continued)

FOREIGN PATENT DOCUMENTS

JP    2004-193595    7/2004
JP    2009-081215    4/2009

OTHER PUBLICATIONS

Koch, R.H., et al. Time-Resolved Reversal of Spin-Transfer Switching in a Nanomagnet, Physical Review Letters, vol. 92, No. 8, week ending ebruary 27, 2004, The American Physical Society.

*Primary Examiner* — Jami M Valentine
(74) *Attorney, Agent, or Firm* — Michael Best & Friedrich LLP

(57) ABSTRACT

A memory element includes a layered structure: a memory layer having a magnetization direction changed depending on information, the magnetization direction being changed by applying a current in a lamination direction of the layered structure to record the information in the memory layer, including a first ferromagnetic layer having a magnetization direction that is inclined from a direction perpendicular to a film face, a bonding layer laminated on the first ferromagnetic layer, and a second ferromagnetic layer laminated on the bonding layer and bonded to the first ferromagnetic layer via the bonding layer, having a magnetization direction that is inclined from the direction perpendicular to the film face, a magnetization-fixed layer having a fixed magnetization direction, an intermediate layer that is provided between the memory layer and the magnetization-fixed layer, and is contacted with the first ferromagnetic layer, and a cap layer that is contacted with the second ferromagnetic layer.

20 Claims, 13 Drawing Sheets

(51) Int. Cl.
*H01L 43/08* (2006.01)
*H01L 27/22* (2006.01)
*G11C 11/16* (2006.01)

(56) References Cited

U.S. PATENT DOCUMENTS

| | | | |
|---|---|---|---|
| 6,937,497 B1* | 8/2005 | Ju et al. | 365/130 |
| 6,992,910 B1* | 1/2006 | Ju | G11C 11/16 257/E27.005 |
| 2002/0034055 A1 | 3/2002 | Seyama et al. | |
| 2002/0085321 A1* | 7/2002 | Carey et al. | 360/324.11 |
| 2002/0085323 A1* | 7/2002 | Smith et al. | 360/324.12 |
| 2005/0002229 A1* | 1/2005 | Matsutera et al. | 365/171 |
| 2006/0154381 A1* | 7/2006 | Gaidis et al. | 438/3 |
| 2006/0175675 A1* | 8/2006 | Braun | H01L 27/222 257/421 |
| 2007/0228501 A1* | 10/2007 | Nakamura et al. | 257/421 |
| 2008/0239589 A1* | 10/2008 | Guo et al. | 360/324.12 |
| 2009/0296462 A1* | 12/2009 | Kent | G11C 11/16 365/171 |
| 2010/0020592 A1* | 1/2010 | Hosotani | G11C 11/16 365/158 |
| 2010/0309713 A1* | 12/2010 | Fukami | G11C 11/16 365/158 |
| 2011/0032645 A1 | 2/2011 | Noel et al. | |
| 2012/0079887 A1* | 4/2012 | Giddings | G01B 7/24 73/779 |
| 2012/0155164 A1* | 6/2012 | Shukh | G11C 11/16 365/171 |
| 2013/0009260 A1* | 1/2013 | Apalkov | H01L 43/08 257/421 |
| 2013/0161770 A1* | 6/2013 | Meng | H01L 43/02 257/421 |
| 2014/0169085 A1* | 6/2014 | Wang | G11C 11/161 365/158 |

* cited by examiner

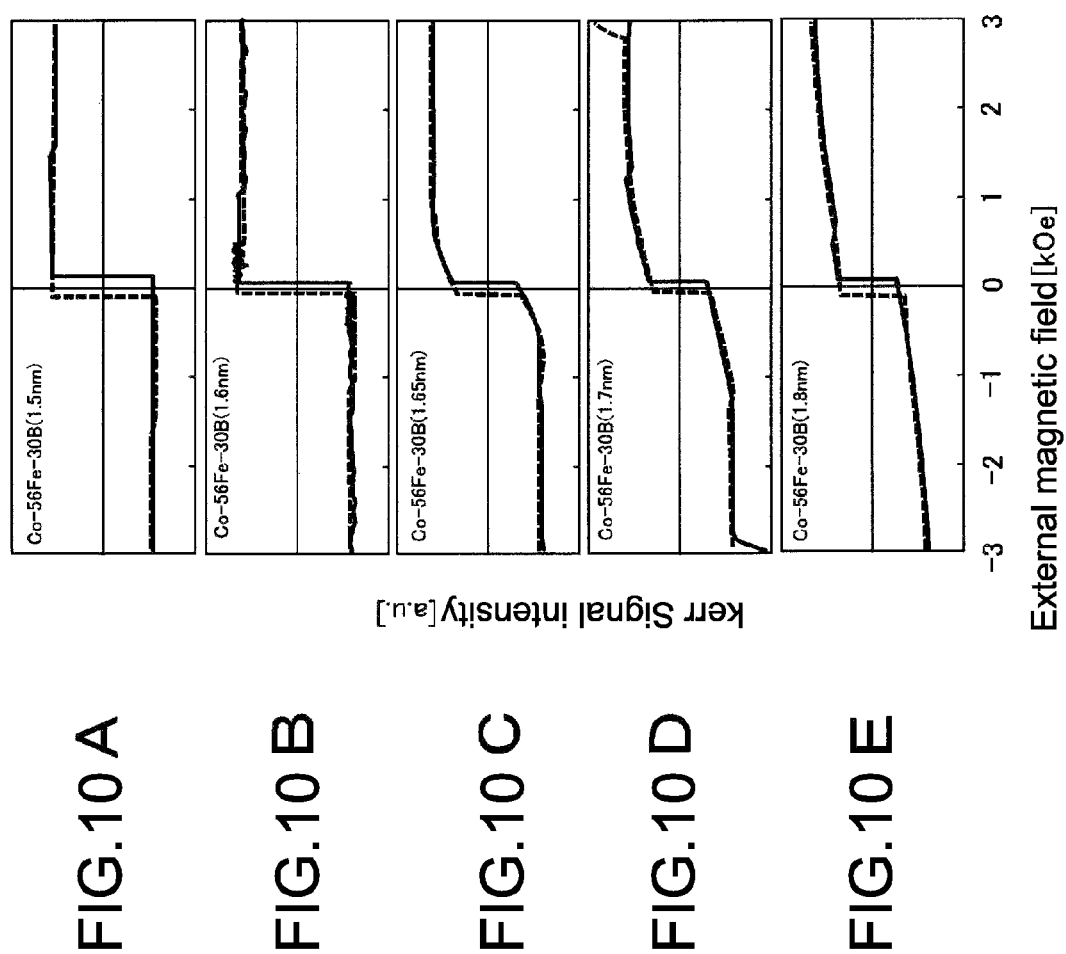

MAGNETIC MEMORY ELEMENT AND MEMORY APPARATUS HAVING MULTIPLE MAGNETIZATION DIRECTIONS

CROSS REFERENCES TO RELATED APPLICATIONS

The present invention is a Continuation of application Ser. No. 13/675,789, filed Nov. 13, 2012, and contains subject matter related to Japanese Patent Application JP 2011-261522 filed in the Japanese Patent Office on Nov. 30, 2011, the entire contents of which being incorporated herein by reference.

BACKGROUND

The present technology relates to a memory element and a memory apparatus.

In an information processing device, a high-speed and high-density Dynamic Random Access Memory (DRAM) is widely used as a random access memory.

However, the DRAM is a volatile memory that loses its information when power is removed. Accordingly, a non-volatile memory that does not lose its information is desirable.

A Magnetic Random Access Memory (MRAM) that records information by magnetization of a magnetic material has been regarded as a possible non-volatile memory, and has been developed.

Recording is made in the MRAM by switching the magnetization using a current magnetic field, or directly injecting spin-polarized electrons into a recording layer to induce magnetization switching (for example, see Japanese Unexamined Patent Application Publication No. 2004-193595).

Among them, spin injection magnetization switching that a recording current can be lowered as a size of an element is decreased is paid attention.

In order to further miniaturize the element, a method of using a perpendicular magnetization film where a magnetization direction of a magnetic material is directed perpendicularly (For example, see Japanese Unexamined Patent Application Publication No. 2009-81215) has been reviewed.

Japanese Unexamined Patent Application Publication No. 2004-193595 discloses an equation of a switching time of a spin injection magnetization switching element using a perpendicular magnetization film.

SUMMARY

However, according to the equation of the switching time shown in Japanese Unexamined Patent Application Publication No. 2004-193595, the switching time of the magnetization of the spin injection magnetization switching element using the perpendicular magnetization film may be longer than that of the spin injection magnetization switching element using no perpendicular magnetization film.

It is desirable to provide a memory element and a memory apparatus that can be operated at high speed with less current.

According to an embodiment of the present technology, a memory apparatus is configured as described below.

In other words, the memory apparatus has a layered structure, including a memory layer that a magnetization direction is changed corresponding to information, a magnetization-fixed layer that the magnetization direction is fixed, an intermediate layer that is formed of a non-magnetic material and is provided between the memory layer and the magnetization-fixed layer and a cap layer, in which the information is recorded by applying a current in a lamination direction of the layered structure to change the magnetization direction of the memory layer.

The memory layer includes a first ferromagnetic layer, a bonding layer and a second ferromagnetic layer laminated in the stated order, the first ferromagnetic layer is magnetically bonded to the second ferromagnetic layer via the bonding layer, the first ferromagnetic layer is contacted with the intermediate layer, the second ferromagnetic layer is contacted with the cap layer, one of the first ferromagnetic layer and the second ferromagnetic layer is an in-plane magnetization layer where in-plane magnetization occurs predominantly, the other is a perpendicular magnetization layer where perpendicular magnetization occurs predominantly, and the magnetization directions of the first ferromagnetic layer and the second ferromagnetic layer are inclined from a direction perpendicular to a film face.

A memory apparatus according to an embodiment of the present technology includes the memory element according to the embodiment of the present technology, an interconnection that supplies a current flowing from the lamination direction to the memory element, and a current supply controller that controls the supply of current to the memory element via the interconnection.

As the magnetization direction of the ferromagnetic layers of the memory layer are inclined from the direction perpendicular to the film face, as soon as a current flows to the memory layer in the direction perpendicular to the film face (a lamination direction of each layer), an amplitude of a precession movement of the magnetization in each ferromagnetic layer is started to be increased. As compared with the configuration where the magnetization direction is not inclined, it is possible to switch the magnetization direction in a shorter time.

Accordingly, when information is recorded by switching the magnetization direction in each ferromagnetic layer of the memory layer, it is possible to shorten the switching time and decrease variability in the switching time.

Thus, the amount of current for recording the information can be decreased, and the information can be recorded in a short time.

Accordingly, the present technology can realize the memory element and the memory apparatus that can operate at high speed with less current.

These and other objects, features and advantages of the present technology will become more apparent in light of the following detailed description of best mode embodiments thereof, as illustrated in the accompanying drawings.

BRIEF DESCRIPTION OF DRAWINGS

FIGS. 10A to 10E each show a Kerr measurement result of each sample in Experiment 1;

DETAILED DESCRIPTION OF EMBODIMENTS

The embodiments of the present technology will be described in the following order.
<1. Schematic Configuration of Memory apparatus according to Embodiment>
<2. General Description of Memory Element according to Embodiment>
<3. First Embodiment>
<4. Second Embodiment>
<5. Simulation Results>
<6. Experiments>
<7. Alternative>
<1. Schematic Configuration of Memory Apparatus According to Embodiment>

Firstly, a schematic configuration of a memory apparatus will be described.

Figure 1:
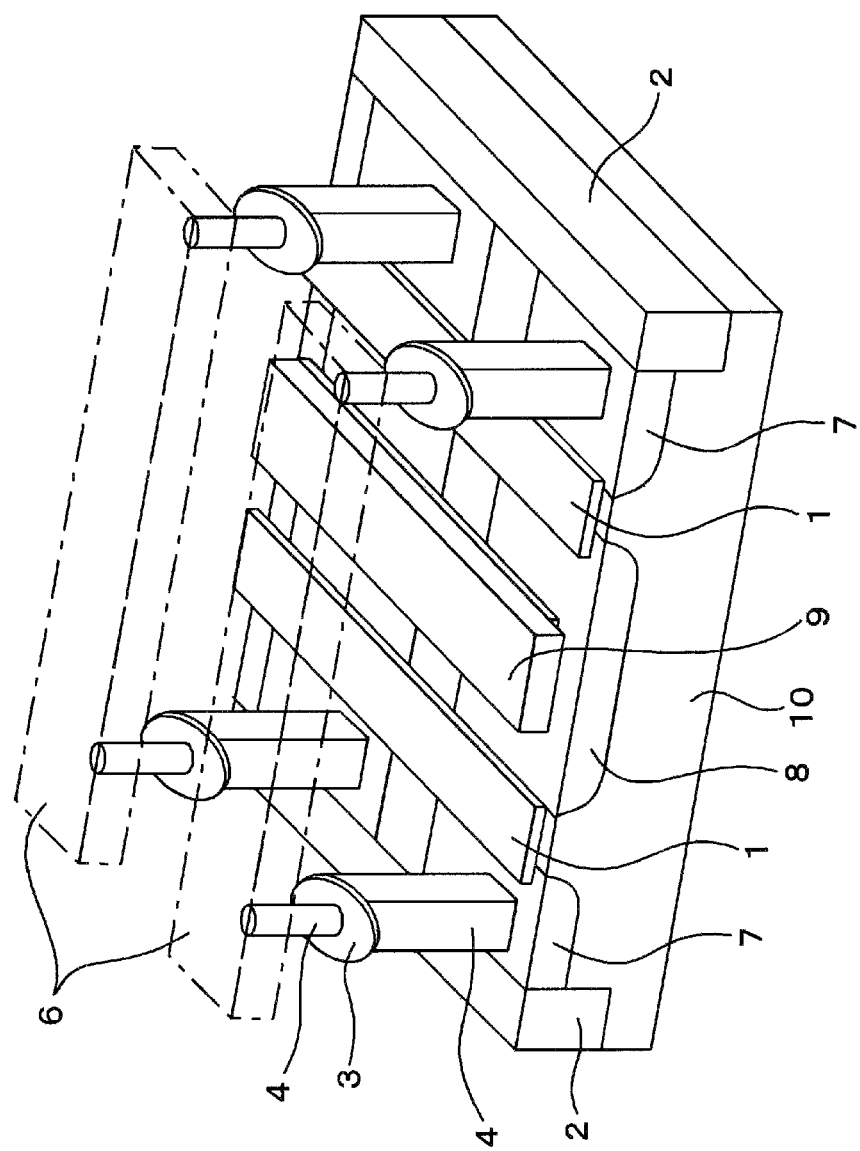
FIG. 1 a schematic perspective view of a memory apparatus according to an embodiment.
Figure 2:
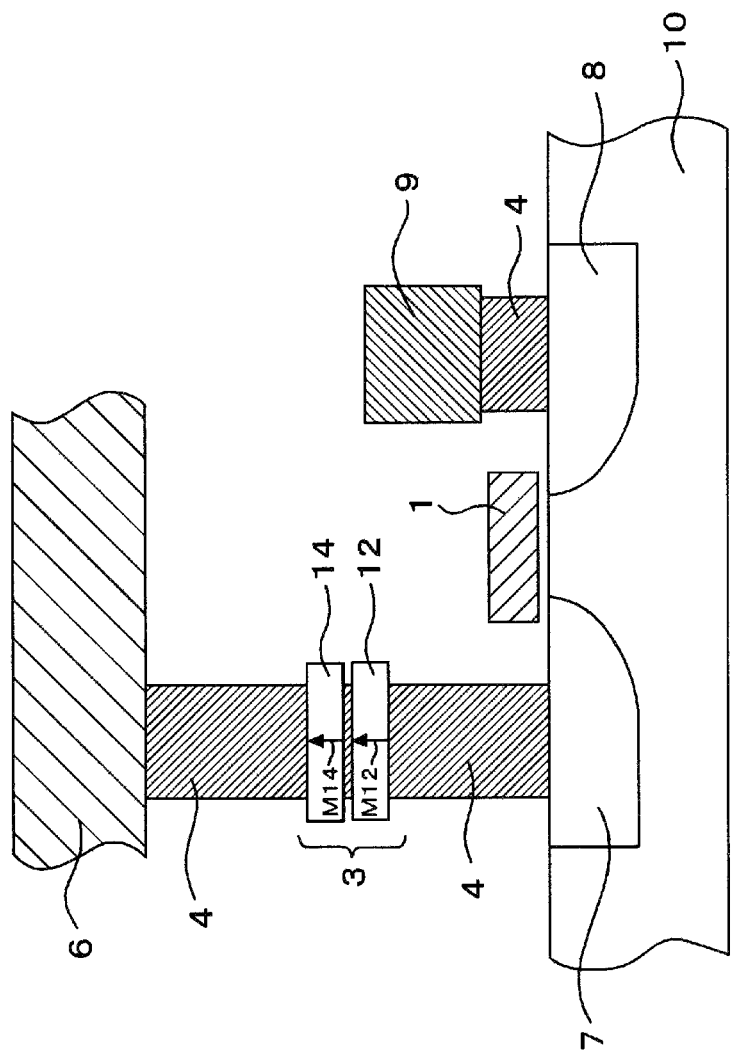
FIG. 2 is a cross-sectional view of a memory apparatus according to an embodiment.
Figure 3:
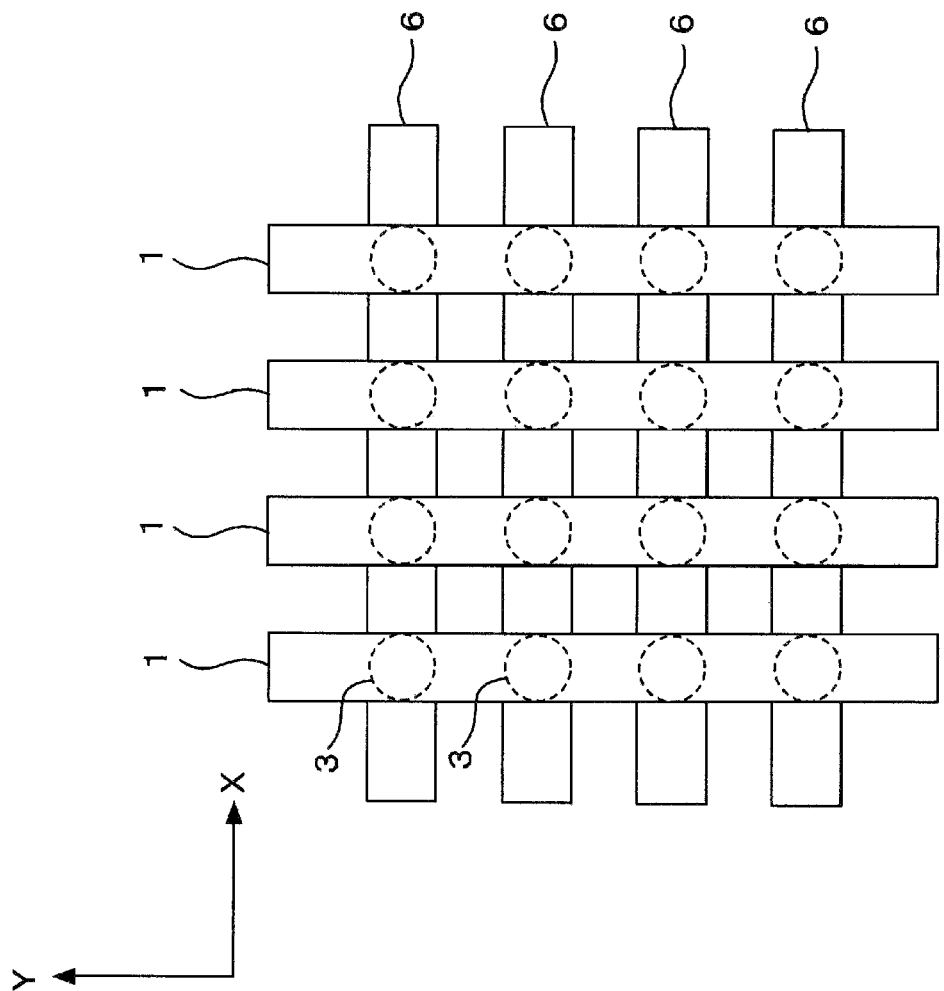
FIG. 3 is a plan view of a memory apparatus according to an embodiment.

FIGS. 1, 2 and 3 each show a schematic diagram of the memory apparatus. FIG. 1 is a perspective view, FIG. 2 is a cross-sectional view and FIG. 3 is a plan view.

As shown in FIG. 1, in a memory apparatus according to an embodiment, a memory element 3 including a Spin Transfer Torque-Magnetic Random Access Memory (STT-MRAM) that can hold information depending on a magnetization state is disposed in the vicinity of an intersection of two kinds of address interconnections (for example, a word line and a bit line) that are perpendicular with each other.

In other words, a drain region 8, a source region 7, and a gate electrode 1 that make up a selection transistor for the selection of each memory element 3 are formed in a semiconductor substrate 10, such as a silicon substrate, at portions isolated by an element isolation layer 2. Among them, the gate electrode 1 functions also as an address interconnection (a word line) extending in the front-back direction in FIG. 1.

The drain region 8 is formed commonly with right and left selection transistors in FIG. 1, and an interconnection 9 is connected to the drain region 8.

The memory element 3 having a memory layer that switches a magnetization direction by a spin torque magnetization switching is disposed between the source region 7 and a bit line 6 that is disposed at an upper side and extends in the right-left direction in FIG. 1. The memory element 3 is configured with, for example, a magnetic tunnel junction element (MTJ element).

As shown in FIG. 2, the memory element 3 has two magnetic layers 12 and 14. In the two magnetic layers 12 and 14, one magnetic layer is set as a magnetization-fixed layer 12 in which the direction of the magnetization M12 is fixed, and the other side magnetic layer is set as a magnetization-free layer in which the direction of the magnetization M14 varies, that is, a memory layer 14.

In addition, the memory element 3 is connected to each bit line 6 and the source region 7 through upper and lower contact layers 4, respectively.

In this manner, when a current in the vertical direction (in a lamination direction) is applied to the memory element 3, the direction of the magnetization M14 of the memory layer 14 can be switched by a spin torque magnetization switching.

As shown in FIG. 3, the memory apparatus is configured by disposing the memory elements 3 at intersections of a number of first interconnections (word lines) 1 and second interconnections (bit lines) 6 that are disposed perpendicularly in matrices.

The memory element 3 has a planar circular shape and a cross-section shown in FIG. 2.

Also, the memory element 3 has the magnetization-fixed layer 12 and the memory layer 14.

The plurality of the memory elements 3 configures a memory cell of the memory apparatus.

In such a memory apparatus, it is necessary to perform writing with a current equal to or less than the saturation current of the selection transistor, and it is known that the saturation current of the transistor decreases along with miniaturization. In order to miniaturize the memory apparatus, it is desirable that spin transfer efficiency be improved and the current flowing to the memory element 3 be decreased.

In addition, it is necessary to secure a high magnetoresistance change ratio to amplify a read-out signal. In order to realize this, it is effective to adopt the above-described MTJ structure, that is, to configure the memory element 3 in such a manner that an intermediate layer is disposed between the two magnetic layers 12 and 14 as a tunnel insulating layer (tunnel barrier layer).

In the case where the tunnel insulating layer is used as the intermediate layer, the amount of the current flowing to the memory element 3 is restricted to prevent the insulation breakdown of the tunnel insulating layer from occurring. That is, it is desirable to restrict the current necessary for the spin torque magnetization switching from the viewpoint of securing reliability with respect to a repetitive writing of the memory element 3. The current necessary for the spin torque magnetization switching is also called as switching current, memory current or the like.

Since the memory apparatus according to the embodiment is a non-volatile memory apparatus, it is necessary to stably store the information written by a current. That is, it is necessary to secure stability (thermal stability) with respect to thermal fluctuations in the magnetization of the memory layer 14.

In the case where the thermal stability of the memory layer 14 is not secured, a switched magnetization direction may be switched again due to heat (temperature in an operational environment), and result in a holding error.

The memory element 3 (STT-MRAM) in the memory apparatus is advantageous in scaling compared to the MRAM in the related art, that is, advantageous in that the volume can be small. However, as the volume is small, the thermal stability may be deteriorated as long as other characteristics are the same.

As the capacity increase of the STT-MRAM proceeds, the volume of the memory element 3 becomes smaller, such that it is important to secure the thermal stability.

Therefore, in the memory element 3 of the STT-MRAM, the thermal stability is a significantly important characteristic, and it is necessary to design the memory element in such a manner that the thermal stability thereof is secured even when the volume is decreased.

<2. General Description about Memory Element According to Embodiment>

Then, a general description about the memory element 3 according to the embodiment will be described.

Firstly, referring to the cross-sectional view of FIG. 4, a schematic configuration of a memory element 3' in the STT-MRAM in the related art will be described in which the magnetization direction of the memory layer (the magnetization direction in an equilibrium state) is perpendicular to the film face.

As will become apparent from the following description, in the memory element 3 according to an embodiment of the present technology, the direction of the magnetization M14 of the memory layer 14 (the direction of the magnetization M14 in an equilibrium state) will not be perpendicular to the film face. In the description referring to FIG. 4, the memory layer "14" of the memory element 3' will be used as a matter of convenience.

Figure 4:
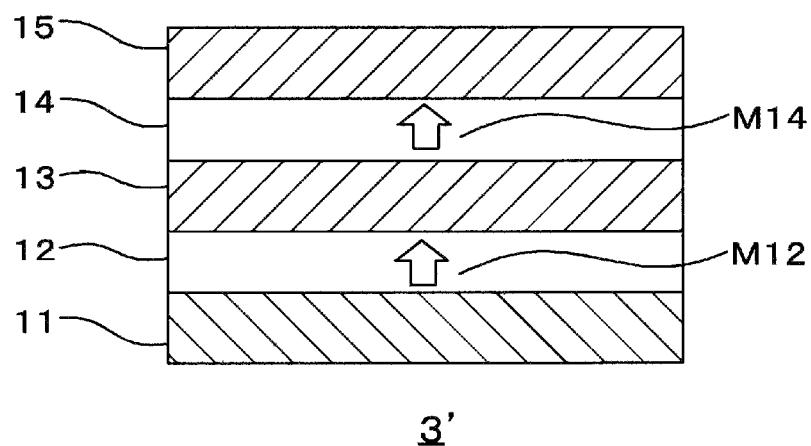
FIG. 4 is a cross-sectional view for illustrating a schematic configuration of an STT-MRAM memory element in the related art where a magnetization direction is perpendicular to a film face.

As shown in FIG. 4, in the memory element 3', a magnetization-fixed layer (also referred to as a reference layer) 12 where a direction of magnetization M12 is fixed, an intermediate layer (non-magnetic layer: tunnel insulating layer) 13, a memory layer (free magnetization layer) 14 where the direction of the magnetization M14 is variable and a cap layer 15 are laminated on an underlying layer 11 in the stated order.

Of these, in the magnetization-fixed layer 12, the direction of the magnetization M12 is fixed by high coercive force or the like. In this case, the magnetization direction of the magnetization-fixed layer 12 is fixed to in a direction perpendicular to the film face.

In the memory element 3', information is stored by the direction of the magnetization M14 (magnetic moment) of the memory layer 14 having uniaxial anisotropy.

Information is written into the memory element 3' by applying a current to in a direction perpendicular to the film face of each layer of the memory element 3' (in other words, a lamination direction of each layer) to induce a spin torque magnetization switching in the memory layer 14.

Here, the spin torque magnetization switching will be briefly described.

For electrons there are two possible values for spin angular momentum. The states of the spin are defined temporarily as up and down.

The numbers of up spin and down spin electrons are the same in the non-magnetic material. But the numbers of up spin and down spin electrons differ in the ferromagnetic material.

Firstly, in the two ferromagnetic layers (the magnetization-fixed layer 12 and the memory layer 14) laminated via the intermediate layer 13, the case that the magnetization directions M12 and M14 are non-parallel and the electrons are moved from the magnetization-fixed layer 12 to the memory layer 14 will be considered.

The electrons passed through the magnetization-fixed layer 12 are spin polarized, that is, the numbers up spin and down spin electrons differs.

When the thickness of the intermediate layer 13 that is the tunnel barrier layer is made to be sufficiently thin, the electrons reach the other magnetic material, that is, the memory layer (free magnetic layer) 14 before the spin polarization is mitigated and the electrons become a non-polarized state in a common non-polarized material (the numbers up spin and down spin electrons are the same) in a non-polarized material.

A sign of the spin polarization in the two ferromagnetic layers (the magnetization-fixed layer 12 and the memory layer 14) is reversed so that a part of the electrons is switched for lowering the system energy, that is, the direction of the spin angular momentum is changed. At this time, the entire angular momentum of the system is necessary to be conserved so that a reaction equal to the total angular momentum change by the electron, the direction of which is changed, is applied also to the magnetic moment of the memory layer 14.

In the case where the current, that is, the number of electrons passed through per unit time is small, the total number of electrons, the directions of which, are changed, becomes small so that the change in the angular momentum occurring in the magnetization M14 of the memory layer 14 becomes small, but when the current increases, it is possible to apply large change in the angular momentum within a unit time.

The time change of the angular momentum with is a torque, and when the torque exceeds a threshold value, the magnetization M14 of the memory layer 14 starts a precession, and rotates 180 degrees due to uniaxial anisotropy of the memory layer 14 to be stable. That is, the switching from non-parallel to parallel occurs.

On the other hand, when the directions of the magnetization M12 and M14 of the two ferromagnetic layers are parallel and the electrons are made to reversely flow from the memory layer 14 to the magnetization-fixed layer 12, the electrons are then reflected at the magnetization-fixed layer 12.

When the electrons that are reflected and spin-switched enter the memory layer 14, a torque is applied and the direction of the magnetization M14 of the memory layer 14 is switched so that it is possible to switch the magnetization M12 and M14 to non-parallel.

However, at this time, the amount of current necessary for causing the switching is larger than that in the case of switching from non-parallel to parallel.

The switching from parallel to non-parallel is difficult to intuitively understand, but it may be considered that the magnetization M12 of the magnetization-fixed layer 12 is fixed such that the magnetic moment is not switched, and the memory layer 14 is switched for conserving the angular momentum of the entire system.

As described above, the recording of 0/1 is performed by applying a current having a predetermined threshold value or more, which corresponds to each polarity, from the magnetization-fixed layer (reference layer) 12 to the memory layer 14 or in a reverse direction thereof.

Reading of information is performed by using a magnetoresistive effect similarly to the MRAM in the related art. That is, as is the case with the above-described recording, a current is applied in a direction perpendicular to the film face (in the lamination direction of each layer). Then, a phenomenon in which an electrical resistance shown by the memory element 3 varies depending on whether or not the direction of the magnetization M14 of the memory layer 14 is parallel or non-parallel to the direction of the magnetization M12 of the magnetization-fixed layer (reference layer) 12 is used.

A material used for the intermediate layer 13 as the tunnel insulating layer may be a metallic material or an insulating material, but the insulating material may be used for the intermediate layer 13 to obtain a relatively high read-out signal (resistance change ratio), and to realize the recording by a relatively low current. The element at this time is called a ferromagnetic tunnel junction (Magnetic Tunnel Junction: MTJ) element.

The above-described spin torque changes by an angle between the direction of the magnetization M14 of the memory layer 14 and the direction of the magnetization M12 of the magnetization-fixed layer (reference layer) 12.

When a unit vector representing the direction of the magnetization M14 is specified as m1 and a unit vector representing the direction of the magnetization M12 is specified as m2, a magnitude of the spin torque is proportional to m1×(m1×m2). Herein, "x" means a cross product of the vectors.

In general, the magnetization M12 of the magnetization-fixed layer 12 is fixed to the easy axis of magnetization of the memory layer 14. The magnetization M14 of the memory layer 14 has a tendency to direct the easy axis of magnetization of the memory layer 14 itself. In this case, m1 and m2 are at 0 degree (parallel) or 180 degrees (non-parallel).

FIG. 4 illustrates the direction of the magnetization M14 and the direction of the magnetization M12 when m1 and m2 are at 0 degree.

Thus, when m1 and m2 are at 0 degree or 180 degrees, the spin torque will not work at all according to the above-described spin torque equation.

However, in practice, as the magnetization M14 of the memory layer 14 is randomly distributed around the easy axis of magnetization of the memory layer 14 due to thermal fluctuations, the spin torque works to induce the magnetization switching, once the angle between the magnetization M14 of the memory layer 14 and the magnetization M12 of the memory layer 12 deviates from 0 degree or 180 degrees.

The time for inducing the magnetization switching (the switching time) depends on the distance from the magnetization M14 to the easy axis of magnetization. The longer the distance from the easy axis of magnetization is, the higher the speed of the magnetization switching is.

As described above, the magnetization M14 of the memory layer 14 and the angle of the easy axis of magnetization are randomly distributed due to thermal fluctuations, resulting in variability of the switching time.

Even if the magnetization M14 is positioned close to (at a close angle) the easy axis of magnetization, in order to switch the magnetization at high speed, it is necessary to flow a larger current.

The present inventors have diligently studied to operate the memory element at high speed with less current.

As a result, it has been found that the memory layer 14 has the configuration that the perpendicular magnetization layer where perpendicular magnetization occurs predominantly is magnetically bonded to the in-plane magnetization layer where in-plane magnetization occurs predominantly via the bonding layer, whereby a magnetic interaction between the magnetization of the in-plane magnetization layer and the magnetization of the perpendicular magnetization layer causes each magnetization to be inclined from the direction perpendicular to the film face.

With such a configuration, it is possible to shorten the switching time and decrease variability in the switching time.

According to the embodiment, in order to magnetically bond the perpendicular magnetization layer where perpendicular magnetization occurs predominantly and the in-plane magnetization layer where in-plane magnetization occurs predominantly via the bonding layer, Co—Fe—B having perpendicular magnetic anisotropy is used.

In general, the ferromagnetic layer used for the memory layer or the like has a significantly thin film thickness as compared with a film surface. In this case, once the magnetization of the ferromagnetic layer directs to the perpendicular direction, a large diamagnetic field is provided. By the interaction between the diamagnetic field and the magnetization, diamagnetic field energy (hereinafter referred to as Ed) increases. As a result, the magnetization cannot face stably to the perpendicular direction and will face to the in-plane direction in the equilibrium state.

However, the ferromagnetic layer may have perpendicular magnetic anisotropy depending on the material and an interfacial state. In this case, perpendicular magnetic anisotropy energy (hereinafter referred to as Ea) induced by the perpendicular magnetic anisotropy acts on the ferromagnetic layer. When the magnetization of the ferromagnetic layer faces to the perpendicular direction of the film face, the net diamagnetic field energy equals to Ed-Ea.

When the diamagnetic field energy is negative, i.e., Ed<Ea, the magnetization can face stably to the perpendicular direction. Such a ferromagnetic layer is hereinafter referred to as "the perpendicular magnetization layer where perpendicular magnetization occurs predominantly".

Adversely, when the diamagnetic field energy is positive, i.e., Ed>Ea, the magnetization cannot face stably to the perpendicular direction. Such a ferromagnetic layer is hereinafter referred to as "the in-plane magnetization layer where in-plane magnetization occurs predominantly".

In general, the Co—Fe—B ferromagnetic layer is the in-plane magnetization layer where in-plane magnetization occurs predominantly.

However, Co—Fe—B can be the perpendicular magnetization layer where perpendicular magnetization occurs predominantly, so long as the conditions are satisfied.

Specifically, when the composition and the film thickness of the Co—Fe—B film are within a certain range and the Co—Fe—B film is contacted with the MgO film, it will be the perpendicular magnetization layer where perpendicular magnetization occurs predominantly (for example, see Japanese Patent Application No. 2010-200983).

The origin of the perpendicular magnetization anisotropy where perpendicular magnetization occurs is said to be interfacial anisotropy at an interface between MgO and Co—Fe—B.

In addition, when both interfaces of the Co—Fe—B film are contacted with the MgO film such as MgO/Co—Fe—B/MgO, the perpendicular magnetization anisotropy will increase (for example, see Japanese Patent Application No. 2010-201526).

<3. First Embodiment>

The specific embodiments of the present technology will be described below.

Figure 5:
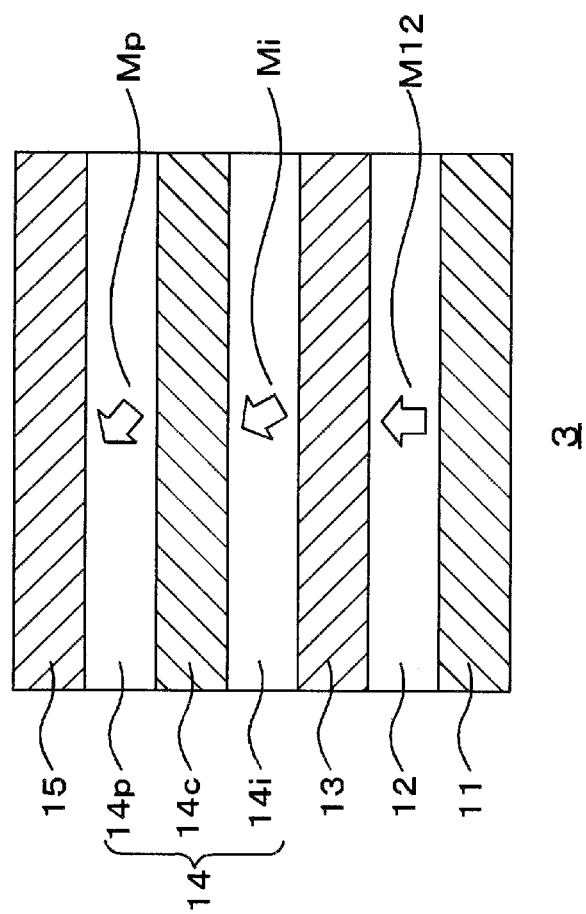
FIG. 5 is a schematic configuration cross-sectional view of a memory element according to a first embodiment.

FIG. 5 shows a schematic configuration view (cross-sectional view) of the memory element 3 according to a first embodiment.

In the description below, a description is omitted as to the parts that are the same as the parts already described by attaching the same signs.

As shown in FIG. 5, in the memory element 3 according to the embodiment, the magnetization-fixed layer (reference layer) 12 where the direction of magnetization M12 is fixed, the intermediate layer (non-magnetic layer: tunnel insulating layer) 13, the memory layer (free magnetization layer) 14 where the direction of the magnetization M14 is variable and the cap layer 15 are laminated on the underlying layer 11 in the stated order.

As described above, in the magnetization-fixed layer 12, the direction of the magnetization M12 is fixed in a direction perpendicular to the film face (upward in the Figure).

The memory element 3 according to the embodiment is different from the former memory element 3' in that the configuration of the memory layer 14 is changed to have a multilayer configuration including the ferromagnetic layers and the bonding layers.

Specifically, the memory layer 14 has a three-layered structure including a ferromagnetic layer 14i, a bonding layer 14c and a ferromagnetic layer 14p are laminated in the stated order.

The ferromagnetic layer 14i is the in-plane magnetization layer where in-plane magnetization occurs predominantly.

The ferromagnetic layer 14p is the perpendicular magnetization layer where perpendicular magnetization occurs predominantly.

In the embodiment, the ferromagnetic layer 14i is contacted with the intermediate layer 13, and the ferromagnetic layer 14p is contacted with the cap layer 15.

In the above-described configuration, the magnetization Mi of the ferromagnetic layer 14i and the magnetization Mp of the ferromagnetic layer 14p are magnetically bonded via the bonding layer 14c.

Here, in the bonding layer 14c, non-magnetic metal such as Ta, Ru and the like can be used.

An insulating material (a variety of oxides and the like) for forming the tunnel insulating layer or non-magnetic metal that is used between the magnetoresistive effect element and the magnetic layer can be used for the intermediate layer (non-magnetic layer) 13 between the magnetization-fixed layer 12 and the memory layer 14.

By using the insulating material as the material of the intermediate layer 13, relatively high read-out signal (resistance change ratio) can be provided, and it is possible to record at a relatively low current, as described above.

In the first embodiment, in order to provide the ferromagnetic layer 14p that is the perpendicular magnetization layer where perpendicular magnetization occurs predominantly, an oxide such as MgO is used for the cap layer 15. Although not shown, the cap layer 15 is configured to laminate non-magnetic metal such as Ta and Ru on the MgO layer, thereby desirably increasing the electrical conductivity.

A variety of magnetic materials used in the STT-MRAM in the related art can be used for the magnetization-fixed layer 12.

For example, NiFe, TePt, CoPt, TbFeCo, GdFeCo, CoPd, MnBi, MnGa, PtMnSb, Co—Fe—B, Co—Cr based material and the like can be used. It is possible to use magnetic materials other than these materials.

A read-out of information is performed by using a magnetoresistive effect similarly to the memory element 3' in the related art. That is, as is the case with the above-described recording of information, current is applied to flow in a direction perpendicular to the film face (in the lamination direction of each layer). Then, a phenomenon is used where an electrical resistance shown by the memory element 3 varies by a relative angle of the direction of the magnetization M12 of the magnetization-fixed layer 12 and the direction of the magnetization M14 of the memory layer 14.

Figure 6:
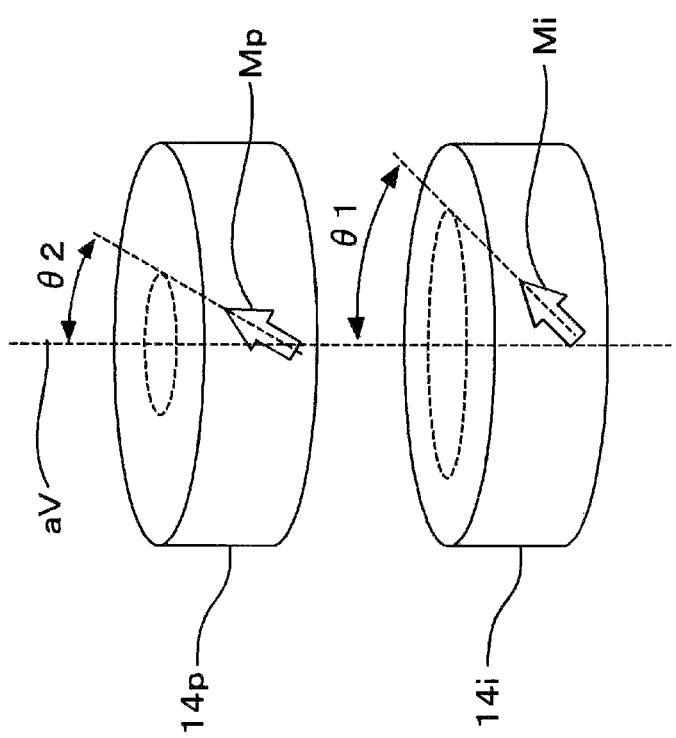
FIG. 6 is a schematic configuration perspective view of a memory layer according to a first embodiment.

FIG. 6 shows the configuration of the memory layer 14 in further detail.

Here, the bonding layer 14c is omitted for the sake of convenience.

In the memory element according to the embodiment, the memory layer 14 has a cylindrical shape.

In order to describe the magnetization Mi and Mp directions, angles θ1 and θ2 are defined as described layer.

Specifically, when an axis pieces through the memory layer 14 in a perpendicular direction is defined as a perpendicular axis aV, the angle θ1 is formed by the magnetization Mi and the perpendicular axis aV, the e2 is formed by the magnetization Mp and the perpendicular axis aV.

As described above, in the magnetization Mi, the in-plane magnetization occurs predominantly, and in the magnetization Mp, the perpendicular magnetization occurs predominantly.

Accordingly, when the magnetization direction is inclined from the perpendicular axis aV with the bond via the bonding layer 14c, the angle θ1 will be greater than the angle θ2. In other words, the magnetization Mi is greatly inclined from the perpendicular axis aV.

The greater the relative angle of the magnetization M12 of the memory layer 12 and the magnetization Mi is, the more the spin torque increases. The above-described configuration of the memory layer 14 can realize the greater magnetization switching.

<4. Second Embodiment>

Figure 7:
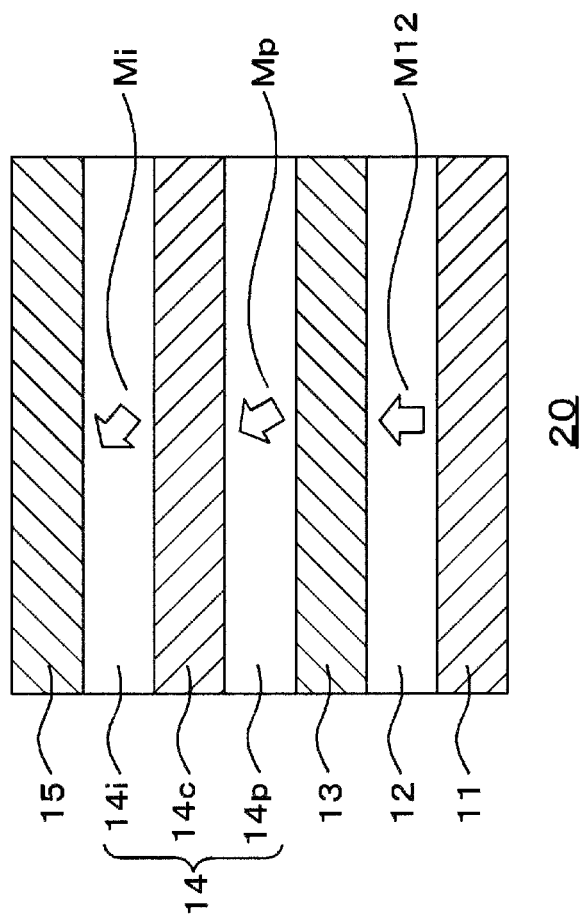
FIG. 7 is a schematic configuration cross-sectional view of a memory element according to a second embodiment.

Next, FIG. 7 shows a schematic configuration view (cross-sectional view) of the memory element 20 according to a second embodiment.

In the memory element 20 according to the second embodiment, the lamination order of the memory layer 14 is different from the memory element 3 according to the first embodiment. Specifically, the ferromagnetic layer 14p, the bonding layer 14c and the ferromagnetic layer 14i are laminated in the stated order.

In this case, the ferromagnetic layer 14p is contacted with the intermediate layer 13, and the ferromagnetic layer 14i is contacted with the cap layer 15.

In order to provide the ferromagnetic layer 14p that is the perpendicular magnetization layer where perpendicular magnetization occurs predominantly, an oxide such as MgO is used for the intermediate layer 13.

In the memory element 20 having the configuration as described above, the spin torque is determined by the relative angle of the magnetization M12 of the memory layer 12 and the magnetization Mp.

In this case, since the angle θ2 is smaller than the angle θ1, the spin torque in the memory element 20 becomes smaller than that in the memory element 3 in the first embodiment. However, as compared with the memory element 3' in the related art, the magnetization direction (the magnetization direction in an equilibrium state) of the memory layer 14 is inclined. As a result, it is possible to switch the magnetization at higher speed.

As described for confirmation, in the memory apparatus according to the second embodiment, the memory element 20 is disposed instead of the memory element 3 in the memory apparatus having the configuration shown in FIGS. 1 to 3.

<5. Simulation Results>

In order to verify advantages of the memory elements (3, 20) in respective embodiments as described above, macro spin model magnetization switching was simulated.

Figure 8A:
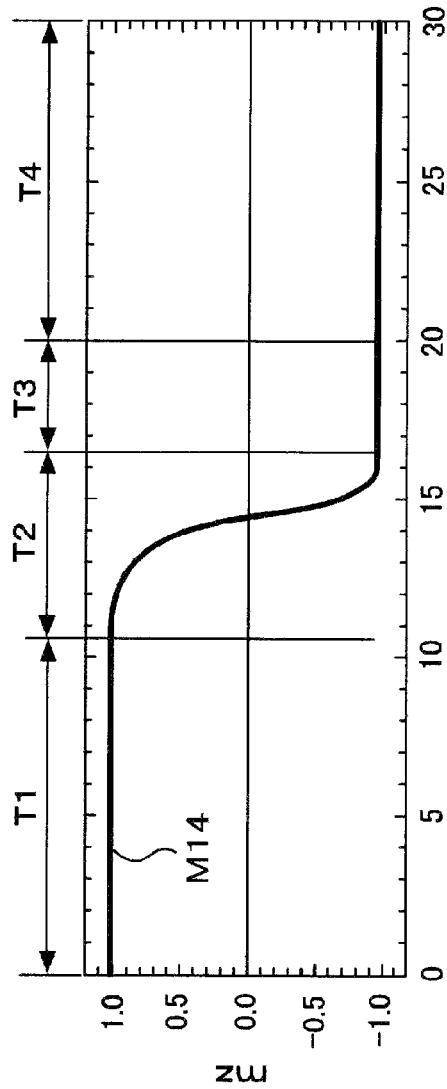
FIGS. 8A and 8B are plots of a relationship between a time and a perpendicular component of the magnetization (Mi) of the memory layer in each of the memory element in the past and the memory element according to an embodiment.
Figure 8B:
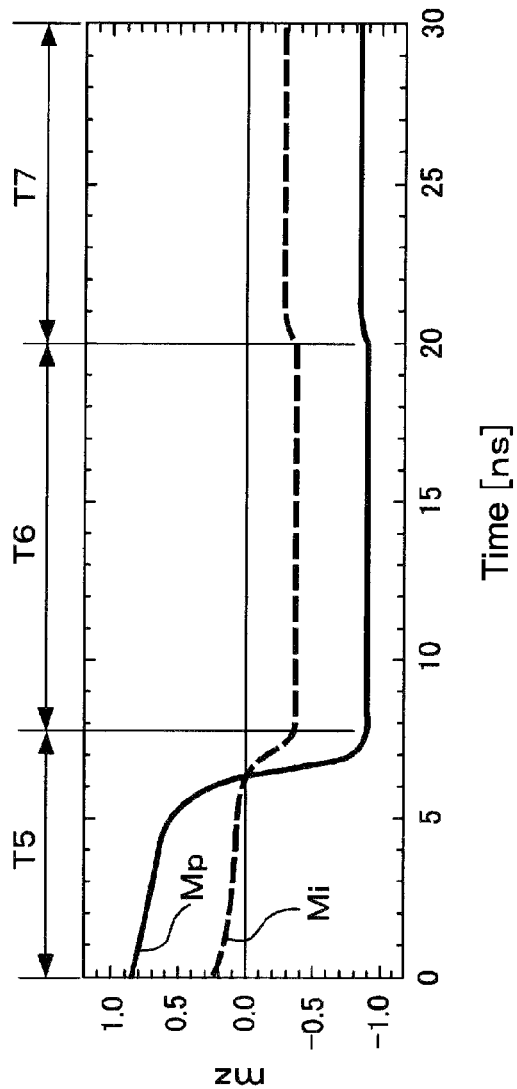

FIGS. 8A and 8B each shows a simulation result of a time change in a perpendicular component of the magnetization, when a current is applied.

FIG. 8A shows the simulation result of the memory element 3' in the related art, and FIG. 8B shows the simulation result of the memory element according to the embodiment. In FIG. 8B, as "the memory element according to the embodiment", the memory element 20 according to the second embodiment was used.

In FIGS. 8A and 8B, the abscissa axis represents the time elapsed after the current is applied, and the horizontal axis represents the perpendicular component of the magnetization. The upward direction approaches to 1, and the downward direction approaches to −1. The time for applying a current (also described as "a current supply time") is set to 20 ns.

In the memory element 3' in the related art, the magnetization M14 of the memory layer 14 is directed to the perpendicular direction in the equilibrium state. Since the spin torque does not work as it is, the calculation is done by displacing 0.01 degrees from the perpendicular axis aV.

In the calculation shown in FIG. 8B, the magnetization Mp of the ferromagnetic layer 14p is directed at angle of 29 degrees from the perpendicular direction in the equilibrium state, and the magnetization Mi of the ferromagnetic layer 14i is directed at angle of 73 degrees from the perpendicular direction in the equilibrium state, respectively.

In the memory element 3' in the related art, the direction of the magnetization M14 is adjacent to the direction perpendicular to the film face, which may decrease the spin torque and the change in magnetization movement to the time change. Accordingly, in a time domain T1 in FIG. 8A, there is almost no change in the magnetization direction, when the current is started to be applied.

Here, the length of the domain T1 changes each time the recording is made, depending on an initial angle of the magnetization. Therefore, the time for inducing the magnetization switching is deviated, and a sufficiently long recording time is necessary for switching the magnetization with certainty.

After the time domain T1, the direction of the magnetization M14 is steeply changed to induce the magnetic switching (a time domain T2). After a time domain T3 where the current is continued to be applied, the current becomes zero in a time domain T4.

In contrast, in the memory element according to the embodiment, the magnetization Mp of the ferromagnetic layer 14p is directed to the direction inclined from the axis perpendicular to the film face. Accordingly, the magnetization Mp of the ferromagnetic layer 14p to which some spin torque is applied concurrently with the application of the recording current will start the switching movement promptly (a time domain T5). At this moment, the magnetization Mi of the ferromagnetic layer 14i will also start the switching movement together with the movement of the magnetization Mp, since the magnetization Mi of the ferromagnetic layer 14i is magnetically bonded to the magnetization Mp.

Thus, the memory element according to the embodiment realizes the switching movement at high speed.

In addition, it can be confirmed that the memory element according to the embodiment has no time domain where the change in the magnetization movement is small such as the time domain T1 shown in FIG. 8A. This means that, by the memory element according to the embodiment, it is possible to shorten the time for applying the recording current and also decrease variability in the switching time.

Here, during a time domain T6 where the current is continued to be applied, the spin torque is applied to the magnetization Mp and the magnetization Mi to deviate them from the equilibrium state.

By the calculation from FIG. 8B, the angle of the magnetization Mp is 156 degrees, and the angle of the magnetization Mi is 112 degrees.

When the current becomes zero in a time domain T7, it changes to the equilibrium state where the angle is inclined from the original perpendicular axis aV. At this time, the angle of the magnetization Mp is 151 degree (180 degrees–29 degrees), and the angle of the magnetization Mi is 107 degrees (180 degrees–73 degrees).

Then, a relationship between a writing error rate and a current supply time will be described.

Figure 9:
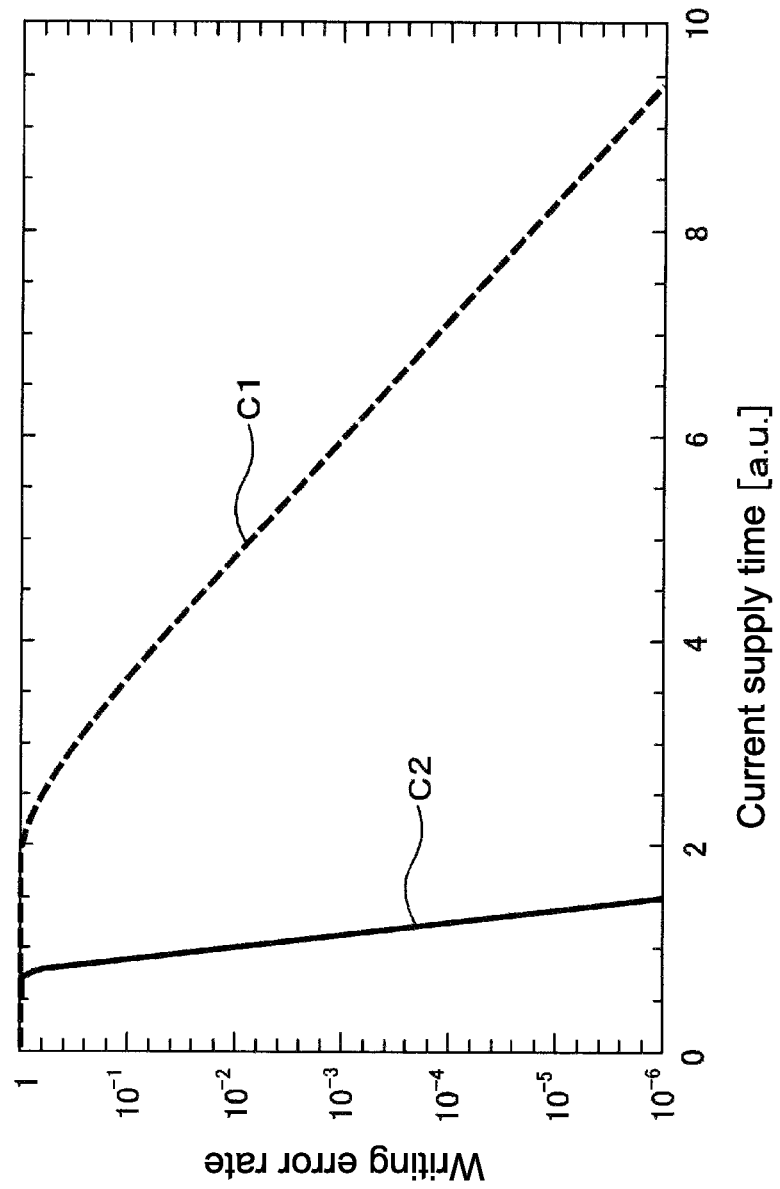
FIG. 9 is a plot showing a dependency of a writing error rate on a current supply time.

FIG. 9 shows the relationship between a writing error rate (a logarithmic value) determined by the simulation and the current supply time.

In FIG. 9, the curve C1 shows the result of the memory element 3' in the related art, and the curve C2 shows the result of the memory element (in this case, the memory element 20) according to the embodiment, respectively.

As described above, in the memory element 3' in the related art, the switching time changes each time the recording is made, depending on an initial angle of the magnetization. Therefore, even though the current supply time is the same, the magnetization switching may be induced or may not be induced.

Here, the probability of not inducing the magnetization switching is called as a writing error rate.

As the current supply time is longer, the probability of inducing the magnetization switching also increases, resulting in a tendency to decrease the writing error rate. In other words, when the current supply time is short, the probability of inducing the switching decreases, so that the writing error rate tends to increase.

As apparent from FIG. 9, the curve C1 for the memory element 3' in the related art has a gentle slope that the writing error rate is decreased slowly to the current supply time.

On the other hand, the curve C2 for the memory element according to the embodiment has a steep slope. In other words, the necessary current supply time of the memory element according to the embodiment is shorter than that of the memory element in the related art when they are compared at the same writing error rate.

This result also supports that the memory element according to the embodiment can write at high speed.

Although the simulation result of the memory element 20 according to the embodiment is shown in FIGS. 8 and 9, the memory element 3 in the first embodiment can also provide an improved result as compared with the memory element 3' in the related art.

<6. Experiments>

Here, in the configuration of the memory element according to the embodiment, by specifically selecting the film thickness of each layer configuring the memory layer 14, the experiments were performed for verifying the inclination of the magnetization direction from the perpendicular axis. The contents and the results are described in [Experiment 1], [Experiment 2] and [Experiment 3] below.

[Experiment 1]

On a silicon substrate having a thickness of 0.725 mm, a thermal oxide film having a thickness of 300 nm was formed, and then a Ta film (15 nm), a Ru film (10 nm), a Pt film (1 nm), a Co film (1.2 nm), a Ru film (0.7 nm), a Co-64Fe-20B film (1.2 nm), a MgO film (0.8 nm), a Co-56Fe-30B film (x nm), a Ta film (0.35 nm), a Co-64Fe-20B film (0.8 nm), a MgO film (0.85 nm), a Ru film (5 nm) and a Ta film (3 nm) were formed in the stated order from the underlying film.

In this case, from the bottom, the Ta film and the Ru film correspond to the underlying layer 11, the Pt film, the Co film, the Ru film and the Co-64Fe-20B film correspond to the magnetization-fixed layer 12 having a synthetic pin layer structure, the MgO film corresponds to the intermediate layer 13, the Co-56Fe-30B film corresponds to the ferromagnetic layer 14i, the Ta film corresponds to the bonding layer 14c, the Co-64Fe-20B corresponds to the ferromagnetic layer 14p, the MgO film, the Ru film and the Ta film correspond to the cap layer 15. In other words, it is the model of the memory element 3 according to the first embodiment.

The Co-56Fe-30B film which corresponded to the ferromagnetic layer 14i had a film thickness t of 1.5 nm, 1.6 nm, 1.65 nm, 1.7 nm or 1.8 nm in each sample.

In the memory element of the STT-MRAM, the magnetization of one (the magnetization-fixed layer 12) of the two ferromagnetic layers that are contacted with the non-magnetic layer (intermediate layer 13) is desirably fixed.

As each sample in Experiment 1, a synthetic pin layer structure having the interlayer bonding was used for fixing the magnetization of the bottom Co-64Fe-20B film.

Using each sample as described above, Kerr was measured. FIGS. 10A to 10E show the results.

In FIGS. 10A to 10E, the abscissa axis represents Kerr signal intensity in any unit that is proportional to the perpendicular component of the magnetization, and the horizontal axis represents the magnetic field applied externally in the perpendicular direction.

FIGS. 10A, 10B, 10C, 10D and 10E show the results when the Co-56Fe-30B film (the ferromagnetic layer 14i) had the film thickness t of 1.5 nm, 1.6 nm, 1.65 nm, 1.7 nm and 1.8 nm, respectively.

Firstly, the Co-56Fe-30B film having the film thickness of 1.5 nm was considered.

As described above, the Co—Fe—B film that is contacted with the MgO film may be the perpendicular magnetization film depending on the interfacial anisotropy. The upper Co-64Fe-20B film corresponding to the ferromagnetic layer 14p induces the interfacial anisotropy at an interface of the MgO film that is the cap layer 15, and becomes the perpendicular magnetization film.

At the same time, the Co-56Fe-30B film that is the ferromagnetic layer 14i induces the interfacial anisotropy at an interface of the MgO film that is the intermediate layer 13 becomes the perpendicular magnetization film. This can be confirmed that the Kerr signal intensity produced by applying external magnetic field of ±3 kOe to direct the magnetization direction entirely to the perpendicular direction, and the Kerr signal intensity produced by applying external magnetic field of 0 kOe to be the magnetization direction in the equilibrium state are about the same. In other words, the magnetization coincides with the perpendicular axis aV in the equilibrium state, which does not form the memory element according to the embodiment of the present technology.

Next, the Co-56Fe-30B film having the film thickness of 1.6 nm or more was considered.

When the film thickness is 1.65 nm or more, a dependency of the Kerr signal intensity on the external magnetic field changes. In other words, the Kerr signal intensity produced by applying external magnetic field of ±3 kOe to direct the magnetization direction entirely to the perpendicular direction, and the Kerr signal intensity produced by applying external magnetic field of 0 kOe to be the magnetization direction in the equilibrium state are different. This means that the magnetization is in the position inclined from the perpendicular axis aV in the equilibrium state, which forms the memory element 3 according to the first embodiment of the present technology.

The dependency of the Co-56Fe-30B film (the ferromagnetic layer 14i) in the equilibrium state on the film thickness can be explained as follows:

The perpendicular magnetic anisotropy induced by the interfacial anisotropy tends to be decreased as the film thickness of the ferromagnetic layer thickens. Therefore, as the film thickness thickens, the Co-56Fe-30 film is changed from the perpendicular magnetization layer where perpendicular magnetization occurs predominantly to the in-plane magnetization layer where in-plane magnetization occurs predominantly. In Experiment 1, it is considered that the boundary existed between 1.6 nm and 1.65 nm. The upper Co-64Fe-20B film corresponding to the ferromagnetic layer 14p becomes the perpendicular magnetization layer where perpendicular magnetization occurs predominantly, and the Co-56Fe-30B film corresponding to the ferromagnetic layer 14i becomes the in-plane magnetization layer where in-plane magnetization occurs predominantly. By magnetic bonding via the Ta film corresponding to the bonding layer 14c, the magnetization direction is inclined from the perpendicular axis aV in the equilibrium state.

[Experiment 2]

On a silicon substrate having a thickness of 0.725 mm, a thermal oxide film having a thickness of 300 nm was formed, and then a Ta film (15 nm), a Ru film (10 nm), a Pt film (1 nm), a Co film (1.2 nm), a Ru film (0.7 nm), a Co-64Fe-20B film (1.2 nm), a MgO film (0.8 nm), a Co-56Fe-30B film (1.7 nm), a Ta film (x nm), a Co-64Fe-20B film (0.8 nm), a MgO film (0.85 nm), a Ru film (5 nm) and a Ta film (3 nm) were formed in the stated order from the underlying film.

In this case, from the bottom, the Ta film and the Ru film correspond to the underlying layer 11, the Pt film, the Co film, the Ru film and the Co-64Fe-20B film correspond to the magnetization-fixed layer 12 having a synthetic pin layer structure, the MgO film corresponds to the intermediate layer 13, the Co-56Fe-30B film corresponds to the ferromagnetic layer 14i, the Ta film corresponds to the bonding layer 14c, the Co-64Fe-20B corresponds to the ferromagnetic layer 14p, the MgO film, the Ru film and the Ta film correspond to the cap layer 15. In other words, it is the model of the memory element 3 according to the first embodiment.

As the result of the former Experiment 1, the upper Co-64Fe-20B film corresponding to the ferromagnetic layer 14p becomes the perpendicular magnetization layer where perpendicular magnetization occurs predominantly, and the Co-56Fe-30B film corresponding to the ferromagnetic layer 14i becomes the in-plane magnetization layer where in-plane magnetization occurs predominantly.

In Experiment 2, the Ta film corresponding to the bonding layer 14c had the film thickness t of 0.35 nm, 0.4 nm, 0.45 nm, or 0.7 nm. The film thicknesses of the Co-64Fe-20B film and the Co-56Fe-30B film were fixed.

FIGS. 11A to 11D show the results of the Kerr measurements using the above-described respective samples.

FIGS. 11A, 11B, 11C and 11D show the results when the Ta film as the bonding layer 14c had the film thickness t of 0.35 nm, 0.4 nm, 0.45 nm and 0.7 nm, respectively.

Firstly, the Ta film corresponding to the bonding layer 14c having the film thickness of 0.35 nm or 0.4 nm was considered. As described in Experiment 1, the magnetization is inclined from the perpendicular axis aV in the equilibrium state within the range.

In contrast, when the Ta film corresponding to the bonding layer 14c has the film thickness of 0.45 nm, there is a step in the course of switching. When the film thickness is 0.7 nm, the magnetization switching obviously occurs in two steps.

This is because the thicker the film thickness of the Ta film corresponding to the bonding layer 14c is, the weaker the magnetic bonding between the ferromagnetic layer 14i and the ferromagnetic layer 14p, so that each magnetization moves independently. In Experiment 2, it is considered that the boundary in which two magnetizations move integrally existed between 0.4 nm and 0.45 nm.

It reveals that when the Ta film has the film thickness of 0.7 nm, two magnetizations move independently, and become the perpendicular magnetizations. When the film thickness of the Ta film is thin, the Co-56Fe-30B film corresponding to the ferromagnetic layer 14i becomes the in-plane magnetization layer where the in-plane magnetization occurs predominantly. Nevertheless, when the thickness of the Ta film thickens, the Co-56Fe-30B film corresponding to the ferromagnetic layer 14i changes to the perpendicular magnetization layer where perpendicular magnetization occurs predominantly. This is because by thickening the film thickness of the Ta film, atom diffusion increases and the effective film thickness of the Co-56Fe-30B film decreases.

As described above, according to Experiments 1 and 2, by selecting the thicknesses of the Co—Fe—B layer and the Ta layer appropriately, the Co-64Fe-20B film corresponding to the ferromagnetic layer 14$p$ becomes the perpendicular magnetization layer where perpendicular magnetization occurs predominantly, and the Co-56Fe-30B film corresponding to the ferromagnetic layer 14$i$ becomes the in-plane magnetization layer where in-plane magnetization occurs predominantly. It is found that when the magnetic bonding via the Ta film corresponding to the bonding layer 14$c$ has an appropriate value, the magnetization direction in the equilibrium state can be inclined from the perpendicular axis aV.

[Experiment 3]

On a silicon substrate having a thickness of 0.725 mm, a thermal oxide film having a thickness of 300 nm was formed, and then a Ta film (5 nm), a Ru film (5 nm), a Pt film (1 nm), a Co film (1.2 nm), a Ru film (0.7 nm), a Co-64Fe-20B film (1.2 nm), a MgO film (0.8 nm), a Co-56Fe-30B film (1.5 nm), a Ta film (0.45 nm), a Co-64Fe-30B film (x nm), a MgO film (0.8 nm), a Ru film (5 nm) and a Ta film (10 nm) were formed in the stated order from the underlying film.

In this case, from the bottom, the Ta film and the Ru film correspond to the underlying layer 11, the Pt film, the Co film, the Ru film and the Co-64Fe-20B film correspond to the magnetization-fixed layer 12 having a synthetic pin layer structure, the MgO film corresponds to the intermediate layer 13, the Co-64Fe-20B film corresponds to the ferromagnetic layer 14$p$, the Ta film corresponds to the bonding layer 14$c$, the Co-56Fe-30B corresponds to the ferromagnetic layer 14$i$, the MgO film, the Ru film and the Ta film correspond to the cap layer 15. In other words, it is the model of the memory element 20 according to the first embodiment.

In Experiment 3, the Co-56Fe-30B film which corresponded to the ferromagnetic layer 14$i$ had a film thickness t of 0.7 nm, 0.75 nm, 0.8 nm, 0.85 nm or 0.9 nm in each sample.

In the memory element of the STT-MRAM, the magnetization of one (the magnetization-fixed layer 12) of the two ferromagnetic layers that are contacted with the intermediate layer (the non-magnetic layer) is desirably fixed. As each sample in Experiment 3, a synthetic pin layer structure having the interlayer bonding was used for fixing the magnetization of the bottom Co-64Fe-20B film (the magnetization-fixed layer 12).

Using each sample as described above, Kerr was measured. FIGS. 12A to 12E show the results when the Co-64Fe-30B film corresponding to the ferromagnetic layer 14$i$ had the film thickness t of 0.7 nm, 0.75 nm, 0.8 nm, 0.85 nm and 0.9 nm, respectively.

In Experiment 3, when the Co-56Fe-30B film corresponding to the ferromagnetic layer 14$i$ has the film thicknesses of 0.7 nm and 0.9 nm, the Kerr signal intensity produced by applying external magnetic field of ±3 kOe to direct the magnetization direction entirely to the perpendicular direction and the Kerr signal intensity produced by applying external magnetic field of 0 kOe to be the magnetization direction in the equilibrium state are about the same. The magnetization coincides with the perpendicular axis aV in the equilibrium state, which does not form the memory element according to the second embodiment.

On the other hand, when the Co-56Fe-30B film has the film thicknesses of 0.75 mm, 0.8 nm and 0.85 nm, the Kerr signal intensity produced by applying external magnetic field of ±3 kOe to direct the magnetization direction entirely to the perpendicular direction and the Kerr signal intensity produced by applying external magnetic field of 0 kOe to be the magnetization direction in the equilibrium state are different. This means that the magnetization is in the position inclined from the perpendicular axis aV in the equilibrium state, which forms the memory element 20 according to the second embodiment of the present technology.

The dependency of the Co-56Fe-30B film in the equilibrium state on the film thickness can be explained as follows:

The perpendicular magnetic anisotropy induced by the interfacial anisotropy tends to be increased as the film thickness of the ferromagnetic layer thins, but tends to be decreased as the film thickness of the ferromagnetic layer thickens. Therefore, the perpendicular magnetic anisotropy increases within a certain film thickness range. The Co-56Fe-30B film corresponding to the ferromagnetic layer 14$i$ is the in-plane magnetization layer where in-plane magnetization occurs predominantly in the film thickness range in which the experiment is performed. It is considered that if there is some perpendicular magnetic anisotropy, the inclined magnetization by bonding with the upper Co-64FE-20B film cannot be provided. In Experiment 3, it is considered that the film thickness range which provides the necessary perpendicular magnetic anisotropy has the lower limit between 0.7 nm and 0.75 nm, and the upper limit between 0.85 nm to 0.9 nm.

Within the film thickness range, the Co-64Fe-20B film corresponding to the ferromagnetic layer 14$p$ becomes the perpendicular magnetization layer where perpendicular magnetization occurs predominantly, and the Co-56Fe-30B film corresponding to the ferromagnetic layer 14$i$ becomes the in-plane magnetization layer where in-plane magnetization occurs predominantly. By magnetic bonding via the Ta film corresponding to the bonding layer 14$c$, the magnetization direction is inclined from the perpendicular axis aV in the equilibrium state.

As described above, according to Experiment 3, by selecting the thicknesses of the Co—Fe—B layer, it is found that the memory element according to the embodiment in which the magnetization direction in the equilibrium state is inclined from the perpendicular axis aV can be provided.

<7. Alternative>

While the embodiments according to the present technology are described, it should be understood that the present technology is not limited to the illustrative embodiments described above.

For example, the composition of the Co—Fe—B film should not be limited to the illustrative compositions (Co:Fe:B=14:56:30 or Co:Fe:B=16:64:20). A variety of compositions can be employed without departing from the spirit and scope of the present technology.

In addition, the Co—Fe—B film may have a single composition or a laminated structure including a plurality of compositions. Furthermore, a non-magnetic element can be added.

Although an oxide such as MgO is cited as the material for inducing the perpendicular magnetic anisotropy to the Co—Fe—B film, it is not limited to the oxide and a variety of materials can be used.

The material of the bonding layer 14$c$ is not limited to Ta, but may be any materials such as Zr, V, Cr, Zr, Mo, W, Ru and Mg that can induce the magnetic bonding between the ferromagnetic layers.

The underlying layer 11 and the cap layer 15 may have a single composition or a laminated structure including a plurality of compositions.

In addition, the magnetization-fixed layer 12 may be configured by a single layer of a ferromagnetic layer, or may have a laminated ferri-pinned structure in which a plurality of ferromagnetic layers is laminated through a non-magnetic layer.

According to the present technology, the memory layer may have a film structure in which the memory layer is positioned at an upper or lower side of the magnetization-fixed layer.

Furthermore, a so-called dual structure in which the magnetization-fixed layers are provided at upper and lower sides of the memory layer can be employed.

The memory elements 3, 20 according to the embodiment of the present technology each have a configuration of the magnetoresistive effect element such as a TMR element. The magnetoresistive effect element as the TMR element can be applied to a variety of electronic apparatuses, electric appliances and the like including a magnetic head, a hard disk drive equipped with the magnetic head, an integrated circuit chip, a personal computer, a portable terminal, a mobile phone and a magnetic sensor device as well as the above-described memory apparatus.

Figures 11A, 11B, 11C, 11D:
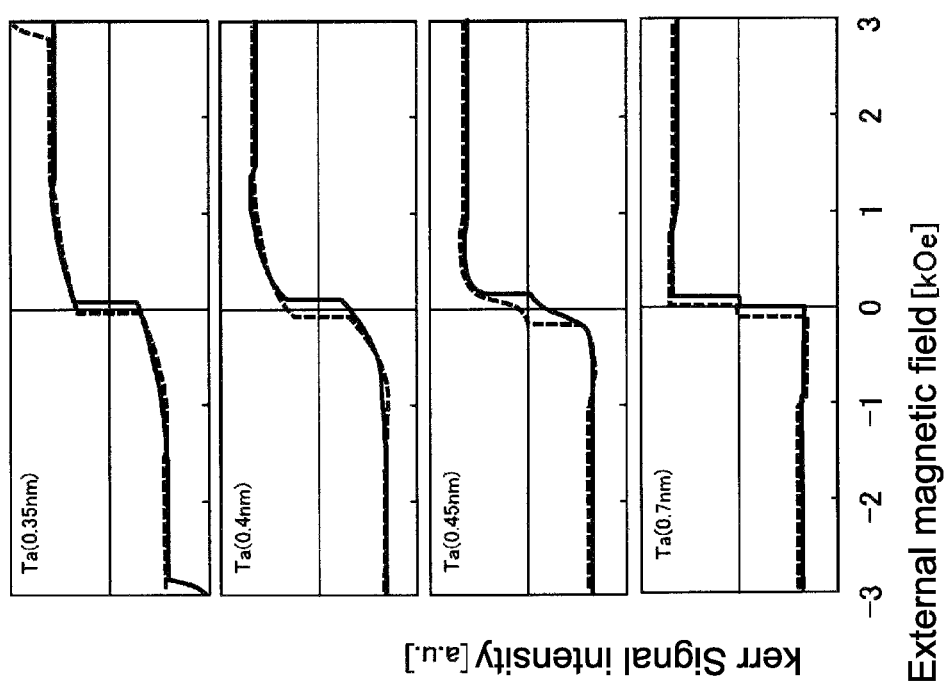
FIGS. 11A to 11D each show a Kerr measurement result of each sample in Experiment 1.
Figures 12A, 12B, 12C, 12D, 12E:
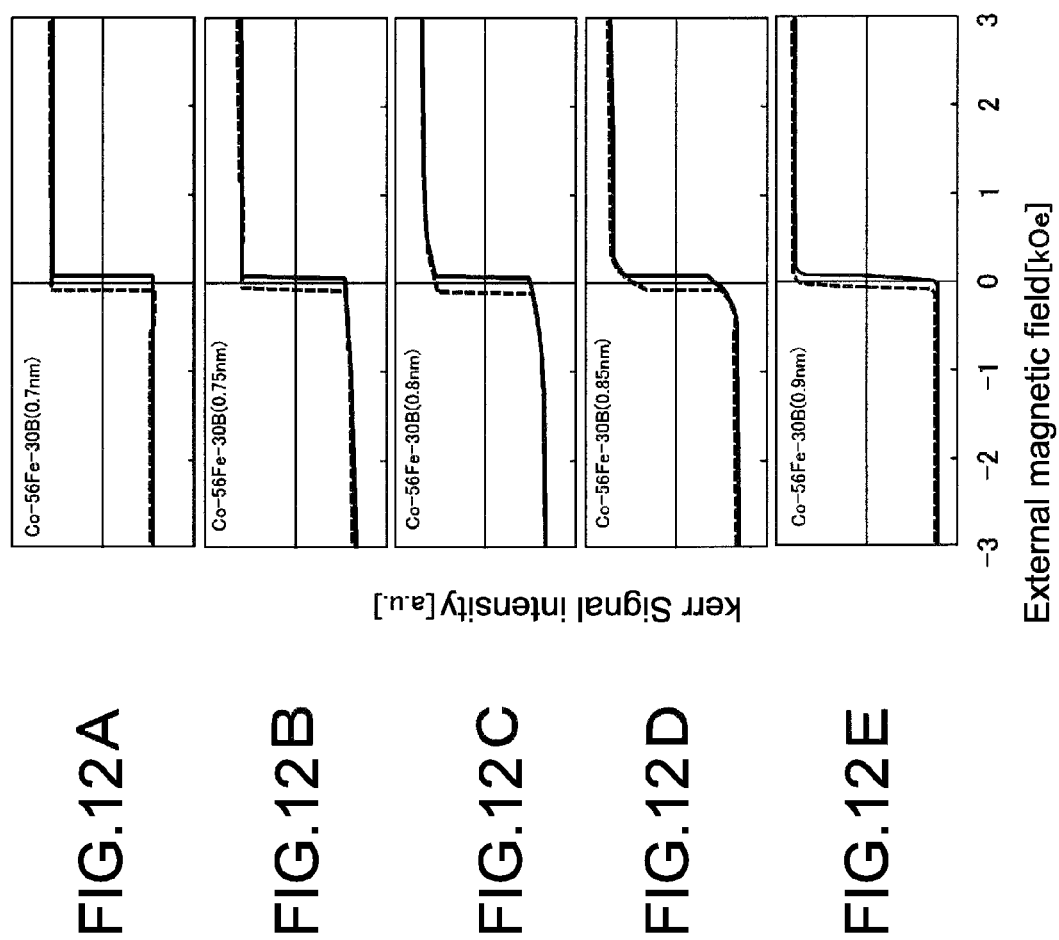
FIGS. 12A to 12E show a Kerr measurement result of each sample in Experiment 1.
Figure 13A:
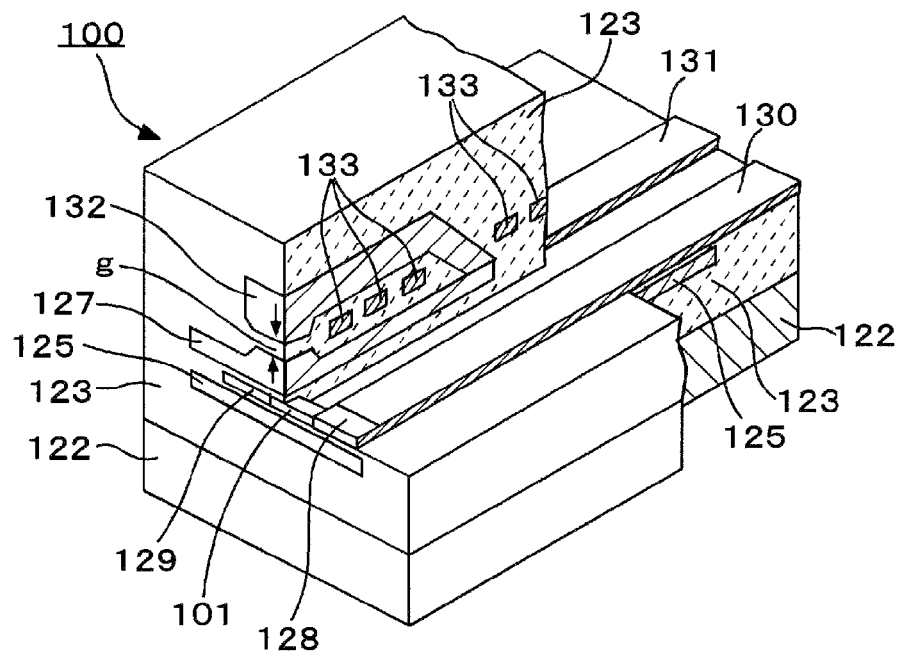
FIGS. 13A and 13B each show an application of a memory element (a magnetoresistive effect element) according to an embodiment to a composite magnetic head.
Figure 13B:
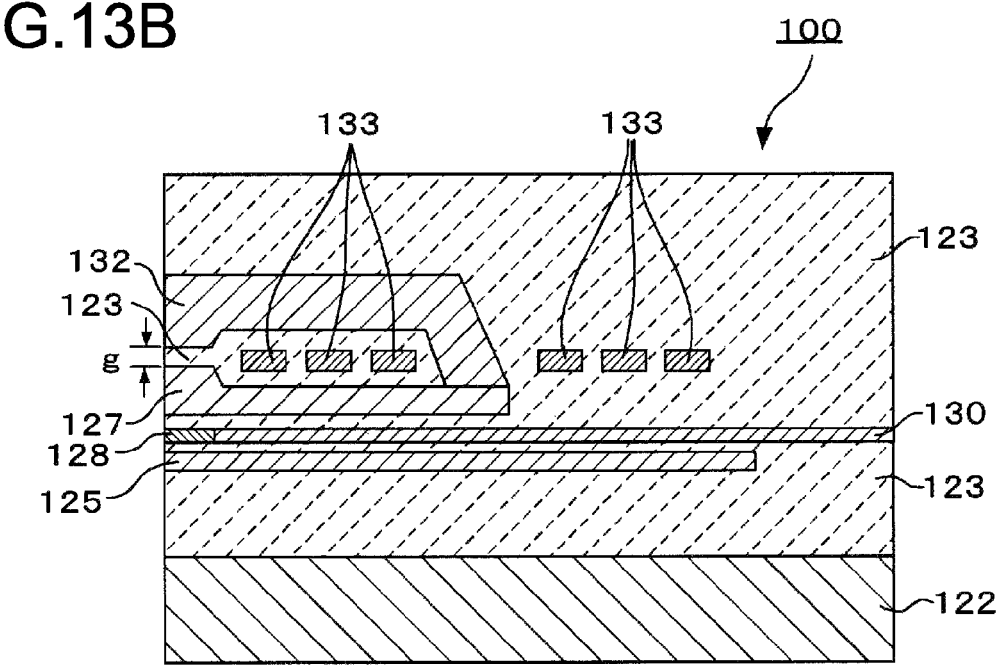

As an example, FIGS. 11A and 11B each show an application of a magnetoresistive effect element 101 having the configuration of the memory element 3 to a composite magnetic head 100. FIG. 11A is a perspective view shown by cutting some parts of the composite magnetic head 100 for discerning the internal configuration. FIG. 11B is a cross-sectional view of the composite magnetic head 100.

The composite magnetic head 100 is a magnetic head used for a hard disk apparatus or the like. On a substrate 122, the magnetoresistive effect magnetic head according to the embodiment of the present disclosure is formed. On the magnetoresistive effect magnetic head, an inductive magnetic head is laminated and thus the composite magnetic head 100 is formed. The magnetoresistive effect magnetic head functions as a reproducing head, and the inductive magnetic head functions as a recording head. In other words, the composite magnetic head 100 is configured by combining the reproducing head and the recording head.

The magnetoresistive effect magnetic head mounted on the composite magnetic head 100 is a so-called shielded MR head, and includes a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 includes an insulation material such as $Al_2O_3$ and $SiO_2$.

The first magnetic shield 125 is for magnetically shielding a lower side of the magnetoresistive effect element 101, and includes a soft magnetic material such as Ni—Fe. On the first magnetic shield 125, the magnetoresistive effect element 101 is formed via the insulating layer 123.

The magnetoresistive effect element 101 functions as a magnetosensitive element for detecting a magnetic signal from the magnetic recording medium in the magnetoresistive effect magnetic head. The magnetoresistive effect element 101 may have the similar film configuration (layer structure) to the above-described memory elements 3, 20.

The magnetoresistive effect element 101 is formed in an almost rectangular shape, and has one side that is exposed to an opposite surface of the magnetic recording medium. At both ends of the magnetoresistive effect element 101, bias layers 128 and 129 are disposed. Also, connection terminals 130 and 131 that are connected to the bias layers 128 and 129 are formed. A sense current is supplied to the magnetoresistive effect element 101 through the connection terminals 130 and 131.

Above the bias layers 128 and 129, the second magnetic shield 127 is disposed via the insulating layer 123.

The inductive magnetic head laminated and formed on the above-described magnetoresistive effect magnetic head includes a magnetic core including the second magnetic shield 127 and an upper core 132, and a thin film coil 133 wound around the magnetic core.

The upper core 132 forms a closed magnetic path together with the second magnetic shield 127, is to be the magnetic core of the inductive magnetic head, and includes a soft magnetic material such as Ni—Fe. The second magnetic shield 127 and the upper core 132 are formed such that front end portions of the second magnetic shield 127 and the upper core 132 are exposed to an opposite surface of the magnetic recording medium, and the second magnetic shield 127 and the upper core 132 come into contact with each other at back end portions thereof. The front end portions of the second magnetic shield 127 and the upper core 132 are formed at the opposite surface of the magnetic recording medium such that the second magnetic shield 127 and the upper core 132 are spaced apart by a predetermined gap g.

In other words, in the composite magnetic head 100, the second magnetic shield 127 not only magnetically shields the upper side of the magnetoresistive effect element 101, but functions as the magnetic core of the inductive magnetic head. The second magnetic shield 127 and the upper core 132 configure the magnetic core of the inductive magnetic head. The gap g is to be a recording magnetic gap of the inductive magnetic head.

In addition, above the second magnetic shield 127, thin film coils 133 buried in the insulation layer 123 are formed. The thin film coils 133 are formed to wind around the magnetic core including the second magnetic shield 127 and the upper core 132. Both ends (not shown) of the thin film coils 133 are exposed to the outside, and terminals formed on the both ends of the thin film coil 133 are to be external connection terminals of the inductive magnetic head. In other words, when a magnetic signal is recorded on the magnetic recording medium, a recording current will be supplied from the external connection terminals to the thin film coil 133.

As described above, a lamination structure of the memory element according to the embodiment of the present technology can be applied to the reproducing head of the magnetic recording medium, i.e., the magnetoresistive effect element for detecting a magnetic signal from the magnetic recording medium.

The present disclosure may also have the following configurations.

(1) A memory element, including:
 a layered structure including
  a memory layer that has a magnetization direction changed depending on information, the magnetization direction being changed by applying a current in a lamination direction of the layered structure to record the information in the memory layer, including
   a first ferromagnetic layer having a magnetization direction that is inclined from a direction perpendicular to a film face,
   a bonding layer laminated on the first ferromagnetic layer, and
   a second ferromagnetic layer laminated on the bonding layer and bonded to the first ferromagnetic layer via the bonding layer, having a magnetization direction that is inclined from the direction perpendicular to the film face,
   one of the first ferromagnetic layer and the second ferromagnetic layer being an in-plane magnetization layer where in-plane magnetization occurs predominantly, the other being a perpendicular magnetization layer where perpendicular magnetization occurs predominantly, a magnetization-fixed layer having a fixed magnetization direction, an intermediate layer that is provided between the memory layer and the magnetization-fixed layer, and is contacted with the first ferromagnetic layer, and a cap layer that is contacted with the second ferromagnetic layer.

(2) The memory element according to (1), in which
the first ferromagnetic layer is the in-plane magnetization layer, and the second ferromagnetic layer is the perpendicular magnetization layer.

(3) The memory element according to (2), in which
the angle formed by the magnetization of the first ferromagnetic layer and the direction perpendicular to the film face is greater than the angle formed by the magnetization of the second ferromagnetic layer and the direction perpendicular to the film face.

(4) The memory element according to (1), in which
the first ferromagnetic layer is the perpendicular magnetization layer, and the second ferromagnetic layer is the in-plane magnetization layer.

(5) The memory element according to (4), in which
the angle formed by the magnetization of the first ferromagnetic layer and the direction perpendicular to the film face is smaller than the angle formed by the magnetization of the second ferromagnetic layer and the direction perpendicular to the film face.

(6) The memory element according to (1) to (5), in which
the intermediate layer is a tunnel insulating layer.

(7) The memory element according to (1) to (6), in which
the cap layer includes an oxide layer.

(8) The memory element according to (1) to (7), in which
the first ferromagnetic layer and the second ferromagnetic layer includes a Co—Fe—B layer.

(9) A memory apparatus, including:
a memory element having
a layered structure including
a memory layer that has a magnetization direction changed depending on information, the magnetization direction being changed by applying a current in a lamination direction of the layered structure to record the information in the memory layer, including
a first ferromagnetic layer having a magnetization direction that is inclined from a direction perpendicular to a film face,
a bonding layer laminated on the first ferromagnetic layer, and
a second ferromagnetic layer laminated on the bonding layer and bonded to the first ferromagnetic layer via the bonding layer, having a magnetization direction that is inclined from the direction perpendicular to the film face,
one of the first ferromagnetic layer and the second ferromagnetic layer being an in-plane magnetization layer where in-plane magnetization occurs predominantly, the other being a perpendicular magnetization layer where perpendicular magnetization occurs predominantly,
a magnetization-fixed layer having a fixed magnetization direction,
an intermediate layer that is provided between the memory layer and the magnetization-fixed layer, and is contacted with the first ferromagnetic layer, and
a cap layer that is contacted with the second ferromagnetic layer;
an interconnection that supplies a current flowing from the lamination direction to the memory apparatus; and
a current supply controller that controls the supply of current to the memory apparatus via the interconnection.

The present technology contains subject matter related to that disclosed in Japanese Priority Patent Application JP 2011-261522 filed in the Japan Patent Office on Nov. 30, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising a layered structure including:
a memory layer having a magnetization direction configured to be changed by in response to a current applied in a lamination direction of the layered structure to record information in the memory layer and at least including:
a first ferromagnetic layer,
a bonding layer laminated on the first ferromagnetic layer, and
a second ferromagnetic layer laminated on the bonding layer;
a fixed-magnetization layer having a fixed magnetization direction parallel to the lamination direction, the lamination direction being a direction perpendicular to a film face of the fixed-magnetization layer; and
an intermediate layer provided between the memory layer and the fixed-magnetization layer,
wherein a magnetization direction in an equilibrium state of the first ferromagnetic layer and a magnetization direction in an equilibrium state of the second ferromagnetic layer are respectively at a first and second predetermined angle relative to the fixed magnetization direction, wherein the first and second predetermined angles are more than 0 degrees and less than 180 degrees relative to the fixed magnetization direction, and the first predetermined angle is different in magnitude from the second predetermined angle.

2. The memory element according to claim 1, wherein
the magnetization direction of the first ferromagnetic layer is closer to a direction parallel to the lamination direction than to a direction perpendicular to the lamination direction, and
the magnetization direction of the second ferromagnetic layer is closer to a direction perpendicular to the lamination direction than to a direction parallel to the lamination direction.

3. The memory element according to claim 2, wherein
the angle formed by the magnetization direction of the first ferromagnetic layer and the direction perpendicular to the lamination direction is greater than the angle formed by the magnetization direction of the second ferromagnetic layer and the direction perpendicular to the lamination direction.

4. The memory element according to claim 1, wherein
the magnetization direction of the first ferromagnetic layer is closer to a direction perpendicular to the lamination direction than to a direction parallel to the lamination direction, and the magnetization direction of the second ferromagnetic layer is closer to a direction parallel to the lamination direction than to a direction perpendicular to the lamination direction.

5. The memory element according to claim 4, wherein the angle formed by the magnetization direction of the first ferromagnetic layer and the direction perpendicular to the lamination direction is smaller than the angle formed by the magnetization direction of the second ferromagnetic layer and the direction perpendicular to the lamination direction.

6. The memory element according to claim 1, wherein the intermediate layer is a tunnel insulating layer.

7. The memory element according to claim 1, further comprising a cap layer including an oxide layer.

8. The memory element according to claim 1, wherein the first ferromagnetic layer and the second ferromagnetic layer respectively include a Co—Fe—B layer.

9. A memory apparatus, comprising:
a memory element having a layered structure including:
a memory layer having a magnetization direction configured to be changed by in response to a current applied in a lamination direction of the layered structure to record information in the memory layer and at least including:
a first ferromagnetic layer,
a bonding layer laminated on the first ferromagnetic layer, and
a second ferromagnetic layer laminated on the bonding layer;
a fixed-magnetization layer having a fixed magnetization direction parallel to the lamination direction, the lamination direction being a direction perpendicular to a film face of the fixed-magnetization layer; and
an intermediate layer provided between the memory layer and the fixed-magnetization layer,
wherein a magnetization direction in an equilibrium state of the first ferromagnetic layer and a magnetization direction in an equilibrium state of the second ferromagnetic layer are respectively at a first and second predetermined angle relative to the fixed magnetization direction, wherein the first and second predetermined angles are more than 0 degrees and less than 180 degrees relative to the fixed magnetization direction, and the first predetermined angle is different in magnitude from the second predetermined angle.

10. The memory apparatus according to claim 9, wherein the magnetization direction of the first ferromagnetic layer is closer to a direction parallel to the lamination direction than to a direction perpendicular to the lamination direction, and the magnetization direction of the second ferromagnetic layer is closer to a direction perpendicular to the lamination direction than to a direction parallel to the lamination direction.

11. The memory apparatus according to claim 10, wherein the angle formed by the magnetization direction of the first ferromagnetic layer and the direction perpendicular to the lamination direction is greater than the angle formed by the magnetization direction of the second ferromagnetic layer and the direction perpendicular to the lamination direction.

12. The memory apparatus according to claim 9, wherein the magnetization direction of the first ferromagnetic layer is closer to a direction perpendicular to the lamination direction than to a direction parallel to the lamination direction, and the magnetization direction of the second ferromagnetic layer is closer to a direction parallel to the lamination direction than to a direction perpendicular to the lamination direction.

13. The memory apparatus according to claim 12, wherein the angle formed by the magnetization direction of the first ferromagnetic layer and the direction perpendicular to the lamination direction is smaller than the angle formed by the magnetization direction of the second ferromagnetic layer and the direction perpendicular to the lamination direction.

14. The memory apparatus according to claim 9, wherein the intermediate layer is a tunnel insulating layer.

15. The memory apparatus according to claim 9, further comprising a cap layer including an oxide layer.

16. The memory apparatus according to claim 9, wherein the first ferromagnetic layer and the second ferromagnetic layer respectively include a Co—Fe—B layer.

17. The memory element according to claim 1, wherein the magnetization direction of the first ferromagnetic layer is closer to the fixed magnetization direction than to a direction perpendicular to the fixed magnetization direction.

18. The memory apparatus according to claim 9, wherein the magnetization direction of the first ferromagnetic layer is closer to the fixed magnetization direction than to a direction perpendicular to the fixed magnetization direction.

19. The memory element according to claim 1, wherein the equilibrium state is a state where no current is applied.

20. The memory apparatus according to claim 9, wherein the equilibrium state is a state where no current is applied.

* * * * *